US008305084B2

(12) United States Patent  (10) Patent No.: US 8,305,084 B2
Ishikawa et al.  (45) Date of Patent: Nov. 6, 2012

(54) VOLTAGE MEASURING APPARATUS FOR ASSEMBLED BATTERY

(75) Inventors: Satoshi Ishikawa, Makinohara (JP);
Kimihiro Matsuura, Makinohara (JP);
Masashi Sekizaki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 281 days.

(21) Appl. No.: 12/852,559

(22) Filed: Aug. 9, 2010

(65) Prior Publication Data

US 2011/0031976 A1  Feb. 10, 2011

(30) Foreign Application Priority Data

Aug. 10, 2009  (JP) ................................. 2009-185704

(51) Int. Cl.
*G01N 27/416* (2006.01)
(52) U.S. Cl. ........................................ 324/433; 324/434
(58) Field of Classification Search ................... 324/433
See application file for complete search history.

(56) References Cited

U.S. PATENT DOCUMENTS 6,664,761 B2  12/2003  Yudahira et al.

FOREIGN PATENT DOCUMENTS

JP  2006-304365 A  11/2006

*Primary Examiner* — Roberto Velez
(74) *Attorney, Agent, or Firm* — Sughrue Mion, PLLC (57) ABSTRACT

A voltage measuring apparatus measures an output voltage of an assembled battery in which a plurality of unit cells are connected in series and are divided into a plurality of blocks. The apparatus includes: a block voltage detection section which detects a voltage of at least one of the plurality of blocks and provides an analog voltage signal; a reference power supply which generates a reference voltage; a sampling voltage generation section which generates a sampling voltage based on the reference voltage; a storage for storing voltage date corresponding to the sampling voltage; and an A/D conversion section of the block voltage detection section that digitizes the sampling voltage with the reference voltage for A/D conversion. A difference between the digitized sampling voltage and the voltage data is calculated and it is determined that abnormality occurs in the A/D conversion section when the difference is larger than a threshold.

5 Claims, 4 Drawing Sheets

VOLTAGE MEASURING APPARATUS FOR ASSEMBLED BATTERY

BACKGROUND OF THE INVENTION

1. Technical Field

The present invention relates to a voltage measuring apparatus which detects a voltage of an assembled battery including a plurality of unit cells connected in series in order to output a desired voltage.

2. Background Art

For example, an electric vehicle or a hybrid vehicle includes a high voltage battery as a motor driving power source. Such a high voltage battery obtains a high voltage by connecting, in series, a plurality of unit cells of a secondary battery (storage battery) such as, for example, a nickel-hydrogen battery, a lithium battery or the like.

In charging or discharging all secondary batteries with the same power, if these secondary batteries have different deterioration conditions, the secondary batteries are prone to an overcharging condition or an overdischarging condition. Therefore, there is a need to check a charging condition of each unit cell to prevent the secondary batteries from being in the overcharging condition or the overcharging condition. Accordingly, a plurality (for example, 55) of unit cells are divided into, for example, 5 blocks (i.e., one block is composed of 11 unit cells), and a voltage of each block is measured in real time by a voltage detection IC provided in each block.

In this case, the voltage detection IC measures a voltage of unit cells (for example, 11 unit cells) of one block, and a detected analog voltage signal is converted into a digital signal by means of an A/D converter included in the voltage detection IC, which is then transmitted to a main microcomputer.

Here, if an abnormality occurs in the A/D converter included in each voltage detection IC, the voltage detected for each unit cell may not be converted into a digital signal correctly. For this reason, the main microcomputer may not acquire correct voltage information, which may result in impossibility of detection of an overcharging condition or an overdischarging condition of a secondary battery.

Therefore, there has been proposed a technique disclosed in, for example, JP-A-2006-304365 which detects an abnormality of an A/D converter quickly. In the technique disclosed in JP-A-2006-304365, a power supply outputting a predetermined output voltage is connected to each voltage detection IC, the output voltage is converted into a digital voltage by means of the A/D converter, and it is determined whether or not the A/D converter works normally by checking a match of the digital voltage value with the predetermined output voltage.

However, in the above-mentioned voltage measuring apparatus, a power supply used to determine the abnormality of the A/D converter is required in addition to a reference power supply used for the A/D conversion, i.e., the reference voltage, which results in higher production costs.

SUMMARY OF THE INVENTION

In consideration of the above problem, it is therefore an object of the present invention to provide a voltage measuring apparatus for an assembled battery, which is capable of determining an abnormality of an A/D converter with high precision as well as providing reduced production costs.

According to an aspect of the present invention, there is provided a voltage measuring apparatus for measuring an output voltage of an assembled battery in which a plurality of unit cells are connected in series and are divided into a plurality of blocks, the voltage measuring apparatus including: a block voltage detection section which detects a voltage of at least one of the plurality of blocks and provides an analog voltage signal; a reference power supply which generates a reference voltage for A/D conversion; a sampling voltage generation section which generates a sampling voltage based on the reference voltage; a storage for storing voltage date corresponding to the sampling voltage; an A/D conversion section which is arranged in the block voltage detection section and digitizes the analog voltage signal with the reference voltage for A/D conversion and digitizes the sampling voltage with the reference voltage for A/D conversion; a voltage comparing section which compares the digitized sampling voltage with the voltage data stored in the storage; and an abnormality determining section which calculates a difference between the digitized sampling voltage and the voltage data and determines that abnormality occurs in the A/D conversion section when the difference is larger than a threshold.

According to the configuration, the sample voltage is generated based on the reference voltage for the A/D conversion output from the reference power supply, and a difference between the digitized sampling voltage obtained by digitizing the sample voltage and the voltage data corresponding to the sample voltage stored in the storage is obtained. If the difference is larger than the threshold, it is determined that an abnormality occurs in the A/D converting section. Accordingly, by generating the sample voltage based on the reference voltage for A/D conversion output from the reference power supply, reduction of production costs can be achieved without requiring a separate power supply used to determine the abnormality of the A/D converter.

In addition, the reference power supply is a power supply which outputs a stable voltage for A/D conversion, i.e., the reference voltage, to the A/D converter. Accordingly, by generating the sample voltage based on the reference voltage for A/D conversion output from the reference power supply, it is possible to determine the abnormality of the A/D converter with high precision.

DETAILED DESCRIPTION OF THE EXEMPLARY EMBODIMENTS

According to an aspect of the present invention, there is provided a voltage measuring apparatus for measuring an output voltage of an assembled battery in which a plurality of unit cells are connected in series and are divided into a plurality of blocks, the voltage measuring apparatus including: a block voltage detection section which detects a voltage of at least one of the plurality of blocks and provides an analog voltage signal; a reference power supply which generates a reference voltage for A/D conversion; a sampling voltage generation section which generates a sampling voltage based on the reference voltage; a storage for storing voltage date corresponding to the sampling voltage; an A/D conversion section which is arranged in the block voltage detection section and digitizes the analog voltage signal with the reference voltage for A/D conversion and digitizes the sampling voltage with the reference voltage for A/D conversion; a voltage comparing section which compares the digitized sampling voltage with the voltage data stored in the storage; and an abnormality determining section which calculates a difference between the digitized sampling voltage and the voltage data and determines that abnormality occurs in the A/D conversion section when the difference is larger than a threshold.

The voltage measuring apparatus may be configured by including a high-voltage side device and a low-voltage side device connected via an insulating interface to the high-voltage side device, wherein the block voltage detection section, the reference power supply, the sampling voltage generation section, the storage, and the A/D conversion, section, are arranged in the high-voltage side device, and the voltage comparing section and the abnormality determining section are arranged in the low-voltage side device.

According to the configuration, the sample voltage is generated based on the reference voltage for A/D conversion output from the reference power supply provided in the high voltage side device, a difference between the digitized sampling voltage and the voltage data corresponding to the sample voltage stored in the storage provided in the low voltage side device connected to the high voltage side device via the insulating interface is obtained, and if the difference is larger than the threshold, it is determined that an abnormality occurs in the A/D converting section. Accordingly, by generating the sample voltage based on the reference voltage for A/D conversion output from the reference power supply, reduction of production costs can be achieved without requiring a separate power supply used to determine the abnormality of the A/D converter.

In addition, the reference power supply is a power supply which outputs a stable voltage for A/D conversion, i.e., the reference voltage, to the A/D converter. Accordingly, by generating the sample voltage based on the reference voltage for A/D conversion output from the reference power supply, it is possible to determine the abnormality of the A/D converter with high precision.

In addition, the difference of voltage data corresponding to the sample voltage stored in the storage provided in the low voltage side device is obtained, and, if the difference is larger than the predetermined threshold, it is determined that an abnormality occurs in the A/D converting section. For this reason, the voltage data corresponding to the sample voltage stored in the storage can be randomly set, thereby providing a voltage measuring apparatus with a wide use.

The voltage measuring apparatus may be configured by including: a first resistor having a first end and a second end, the first end connected to the reference power supply; and a second resistor connected to the second end of the first resistor from the reference power supply in series, wherein the sampling voltage generation section generates the sampling voltage by dividing the reference voltage by the first and second resistors.

According to the configuration, the sample voltage generating section generates the sample voltage by dividing the reference voltage by means of the first resistor whose first end is connected to the reference power supply and the second resistor connected to a second end of the first resistor and connected in series from the reference power supply. Accordingly, by changing resistance values of the first and second resistors, it is possible to set the generated sample voltage randomly.

The voltage measuring apparatus may be configured by including: a first resistor having a first end and a second end, the first end connected to the reference power supply; a second resistor connected to the second end of the first resistor from the reference power supply in series; and a third resistor connected to the second end of the first resistor and connected in parallel to the second resistor, wherein the sampling voltage generation section has an ability of generating a plurality of sampling voltages by switching a connection state of at least one of the second and third resistors.

According to the configuration, the sample voltage generating section can generate the plurality of sample voltages by switching a connection state of at least one of the second and third resistors connected in parallel to the second resistor. In this case, the plurality of sample voltages can be generated by setting the second and third resistors to different resistance values.

The voltage measuring apparatus may be configured by including a high-voltage side device and a low-voltage side device connected via an insulating interface to the high-voltage side device, wherein the block voltage detection section, the reference power supply, the sampling voltage generation section, the storage, the A/D conversion section, the voltage comparing section and the abnormality determining section are arranged in the high-voltage side device, and the abnormality determining section transmits an abnormality determination result to the low-voltage side device.

According to the configuration, the voltage comparing section and the abnormality determining section are also arranged in the high-voltage side device. Then, the abnormality determination result is transmitted to side of the low-voltage side device, e.g., to a main microcomputer of the low-voltage side device. Thus, the abnormality can be determined in each block at a side of the high-voltage side device without communicating with the low-voltage side device.

Embodiment

Figure 1:
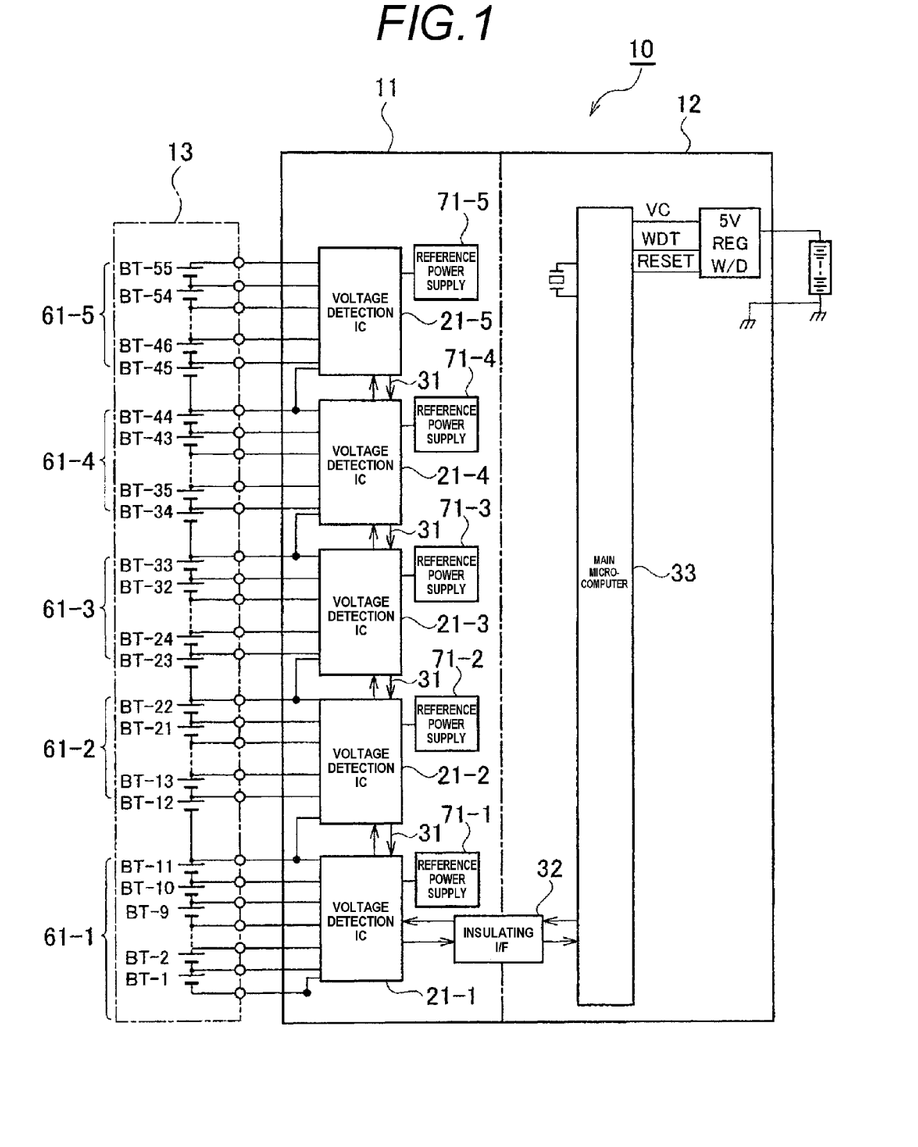
FIG. 1 is a block diagram showing a configuration of a voltage measuring apparatus for an assembled battery according to an embodiment of the present invention.

Hereinafter, embodiments of the present invention will be described with reference to the drawings. FIG. 1 is a block diagram showing a voltage measuring apparatus 10 and a secondary battery 13 (an assembled battery) composed of a plurality of unit cells BT1 to BT55 according to an embodiment of the present invention. The secondary battery 13 employed in this embodiment is used as a high voltage battery for driving a motor used for, for example, an electric vehicle, a hybrid vehicle or the like.

As shown in FIG. 1, the voltage measuring apparatus 10 according to this embodiment is divided into a high voltage side device 11 and a low voltage side device 12 with an insulating interface 32 interposed therebetween.

The high voltage side device 11 includes 5 voltage detection ICs (block voltage detecting section), i.e., first to fifth voltage detection ICs 21-1 to 21-5. The first voltage detection IC 21-1 measures output voltages of 11 unit cells BT1 to BT11 designated as a first block 61-1. Similarly, the second voltage detection IC 21-2 measures output voltages of 11 unit cells BT12 to BT22 designated as a second block 61-2, the third voltage detection IC 21-3 measures output voltages of 11 unit cells BT23 to BT33 designated as a third block 61-3, the fourth voltage detection IC 21-4 measures output voltages of 11 unit cells BT34 to BT44 designated as a fourth block 61-4, and the fifth voltage detection IC 21-5 measures output voltages of 11 unit cells BT45 to BT55 designated as a fifth block 61-5.

In addition, each voltage detection IC 21-1 to 21-5 has a respective A/D converter (A/D converting section) 26 (see FIG. 2 which will be described later) which uses a reference voltage Vf0 output from each reference power supply 71-1 to 71-5 for A/D conversion to convert an analog voltage signal (a voltage signal from 11 unit cells connected in series) measured for each block (the first to fifth blocks) into a digital voltage signal.

Additionally, the second to fifth voltage detection ICs 21-2 to 21-5 are connected to the first voltage detection IC 21-1 via a communication line 31, and the first voltage detection IC 21-1 is connected to a main microcomputer 33 provided in the low voltage side device 12 via the insulating interface 32. That is, the main microcomputer 33 and each voltage detection IC 21-1 to 21-5 are connected via the insulating interface 32 in daisy chain communication.

In addition, in the voltage measuring apparatus 10 according to this embodiment, each voltage detection IC 21-1 to 21-5 generates a sample voltage based on the reference voltage Vf0 for A/D conversion output from each reference power supply 71-1 to 71-5 and transmits a digital voltage, into which the sample voltage is converted by means of the A/D converter 26, to the main microcomputer 33. The main microcomputer 33 (voltage comparing section and abnormality determining section) has a memory (storage) (not shown) for data storage and compares the transmitted digital voltage with voltage data corresponding to the sample voltage stored beforehand in the memory to determine an abnormality of the A/D converter 26. It will be described later in detail.

Figure 2:
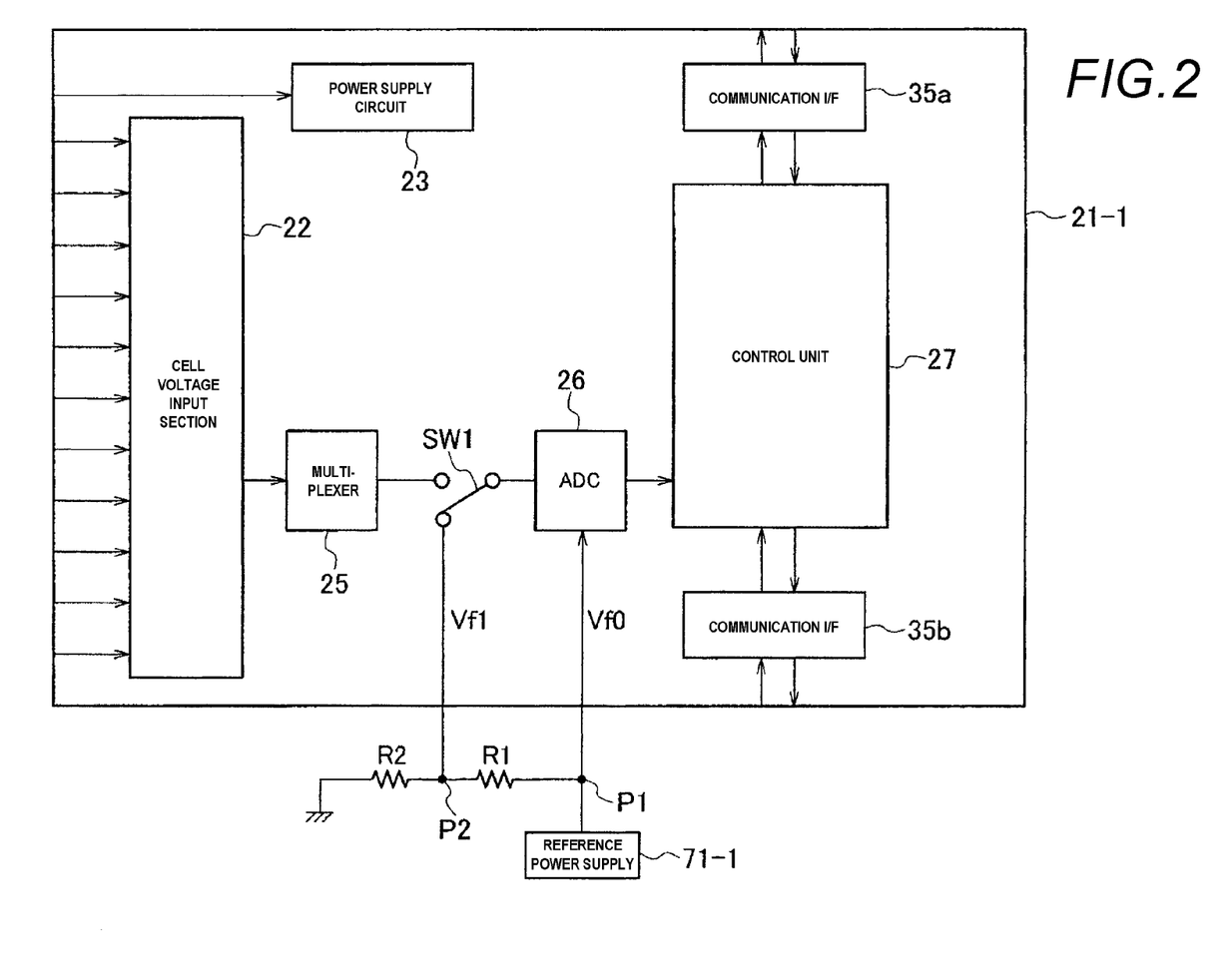
FIG. 2 is a block diagram showing a detailed configuration of the voltage measuring apparatus according to the embodiment of the present invention.

FIG. 2 is a block diagram showing an internal configuration of the first voltage detection IC 21-1. Hereinafter, the detailed configuration of the first voltage detection IC 21-1 will be described with reference to FIG. 2. The second to fifth voltage detection ICs 21-2 to 21-5 have the same configuration as that of the first voltage detection IC 21-1, and therefore, detailed explanation thereof will be omitted.

As shown in FIG. 2, the first voltage detection IC 21-1 includes a power supply circuit 23 which receives power output from the unit cells and generates a predetermined voltage, a cell voltage input section 22 which is connected to the unit cells BT1 to BT11 provided in the block 61-1 and detects output voltage of the unit cells, a multiplexer 25 which converts voltage signals of the unit cells output from the cell voltage input section 22 into a time series of signals, and an A/D converter 26 which converts the voltage signals of the unit cells output from the multiplexer 25 into digital signals. The A/D converter 26 converts an analog voltage signal into a digital voltage signal using the reference voltage Vf0 for A/D conversion, which is output from the reference power supply 71-1.

In addition, the first voltage detection. IC 21-1 includes first and second resistors R1 and R2 (sample voltage generating section) which divide the reference voltage Vf0 output from the reference power supply 71-1 to generate a sample voltage Vf1, and a switch SW1 which switches between a voltage signal of each unit cell output from the multiplexer 25 and a voltage signal outputting the sample voltage Vf1.

The first resistor R1 has one end (first end) connected to a node P1 which is an output terminal of the reference power supply 71-1 and the other end (second end) connected to a node P2 which is an output terminal which outputs the sample voltage Vf1 to the A/D converter 26. In addition, the second resistor R2 connected in series from the reference power supply 71-1 is connected to the node P2.

Then, when the sample voltage Vf1 is generated by the first and second resistors R1 and R2 dividing the reference voltage Vf0, the switch SW1 switches the voltage signal of each unit cell to supply the sample voltage Vf1 to the A/D converter 26.

In the sample voltage Vf1, for example, if a reference voltage of 5V for MD conversion is output from the reference power supply 71-1, assuming a resistance value of the first resistor R1 is equal to a resistance value of the second resistor R2, the reference voltage of 5V is divided by the first and second resistors R1 and R2 to generate a sample voltage 2.5V which is then supplied to the A/D converter 26. This sample voltage Vf1 has a very highly-precise voltage value since it is generated by dividing the voltage output from the reference power supply 71-1.

In addition, the first voltage detection IC 21-1 has a control unit 27 and two communication I/Fs 35a and 35b. The control unit 27 performs a process of transmitting the digital voltage digitized by the A/D converter 26 to the main microcomputer 33 shown in FIG. 1 via the communication I/Fs 35a and 35b.

Figure 3:
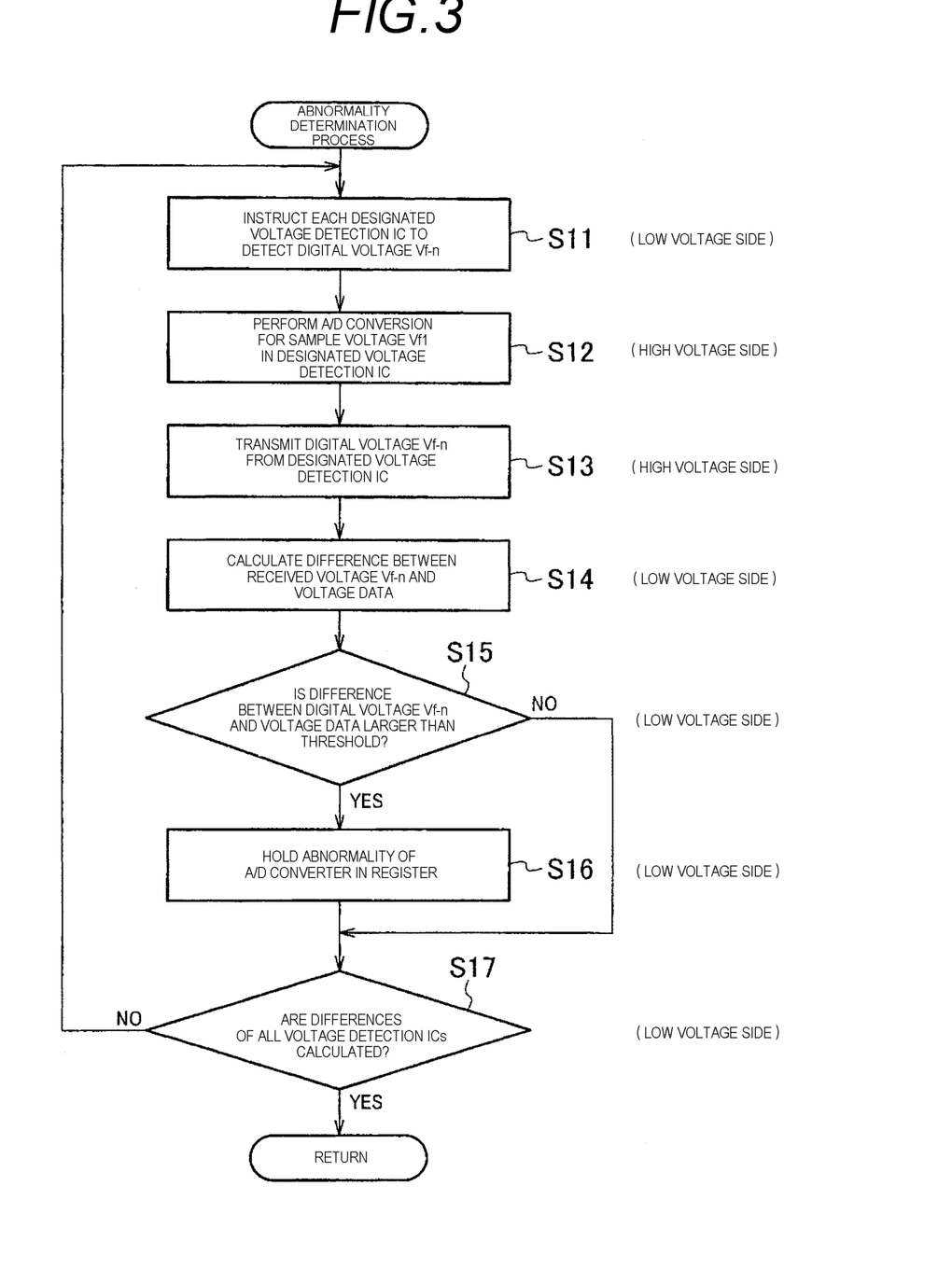
FIG. 3 is a flow chart showing steps of an abnormality determination process of the voltage measuring apparatus according to the embodiment of the present invention.

Next, an abnormality determination process for the A/D converter 26, which is performed by the voltage measuring apparatus 10 according to this embodiment as configured above, will be described with reference to a flow chart shown in FIG. 3.

First, in Step S11, the main microcomputer 33 transmits a signal for instructing the detection of a digital voltage Vf1-$n$ obtained by digitizing the sample voltage Vf1, to each voltage detection IC 21-1 to 21-5. Here, a suffix "-n" is appended in order to distinguish between the sample voltage Vf1 generated by each voltage detection IC 21-1 to 21-5 and a digital voltage obtained by digitizing the sample voltage Vf1. For example, digital voltages generated in the first to fifth voltage detection ICs 21-1 to 21-5 are denoted by "Vf1-1," "Vf1-2," "Vf1-3," "Vf1-4," and "Vf1-5," respectively.

In Step S12, in the voltage detection ICs 21-1 to 21-5 instructed by the main microcomputer 33, the A/D converter 26 performs the A/D conversion for the sample voltage Vf1 generated by dividing the reference voltage Vf0, which is output from the reference power supplies 71-1 to 71-5, by means of the first and second resistors R1 and R2 (see FIG. 2), to generate digital voltages Vf1-1 to Vf1-5.

In Step S13, the voltage detection ICs 21-1 to 21-5 instructed by the main microcomputer 33 transmit the digital voltages Vf1-1 to Vf1-5 to the main microcomputer 33 via the insulating interface 32.

In Step S14, the main microcomputer 33 compares the digital voltages Vf1-1 to Vf1-5 transmitted from the instructed voltage detection ICs 21-1 to 21-5 with voltage data corresponding to the sample voltage Vf1 stored beforehand in the memory (not shown) of the main microcomputer 33 to calculate a difference between each of the digital voltages Vf1-1 to Vf1-5 and the voltage data.

In Step S15, the main microcomputer 33 determines whether or not the difference between each of the digital voltages Vf1-1 to Vf1-5 and the voltage data is larger than a predetermined threshold. If it is determined that the difference between any of the digital voltages Vf1-1 to Vf1-5 and the voltage data is larger than the predetermined threshold (YES in Step S15), the main microcomputer 33 holds an abnormality of the A/D converter in a register (not shown) of the main microcomputer 33. In addition, the main microcomputer 33 transmits the abnormality of the A/D converter to an upper level device (not shown) of the voltage detection ICs 21-1 to 21-5 which determine the abnormality of the A/D converter held in the register to inform the voltage detection ICs 21-1 to 21-5 which determine the abnormality of the A/D converter.

On the other hand, in Step S15, if it is determined that the difference between each of the digital voltages Vf1-1 to Vf1-5 and the voltage data is smaller than the predetermined threshold (NO in Step S15) or Step S16 has been performed, the main microcomputer 33 determines whether or not differences for all of the voltage detection ICs 21-1 to 21-5 have been calculated in Step S17. If it is determined that differences for all of the voltage detection ICs 21-1 to 21-5 have been calculated (YES in Step S17), the main microcomputer 33 ends the abnormality determination process.

On the other hand, if it is determined in Step S17 that differences for all of the voltage detection ICs 21-1 to 21-5 have not been calculated (NO in Step S17), the main microcomputer 33 returns to Step S11 where the main microcomputer 33 transmits a signal for instructing voltage detection ICs 21-1 to 21-5, which have not calculated the differences, to detect a digital voltage Vf1-n obtained by digitizing the sample voltage, to the voltage detection ICs 21-1 to 21-5.

As described above, the main microcomputer 33 generates the sample voltage Vf1 by dividing the reference voltage Vf0 in the voltage detection ICs 21-1 to 21-5, obtains the differences by comparing the digital voltages Vf1-1 to Vf1-5 with the voltage data stored beforehand in the memory (not shown), and determines that an abnormality occurs in the A/D converter 26 if the differences are larger than the predetermined threshold.

In this manner, the voltage measuring apparatus 10 according to this embodiment generates the sample voltage Vf1 based on the reference voltage Vf0 for A/D conversion output from the reference power supplies 71-1 to 71-5 provided in the high voltage side device 11, obtains differences between the digital voltages Vf1-1 to Vf1-5, which are obtained by digitizing the sample voltage Vf1 by means of the A/D converter 26, and the voltage data corresponding to the sample voltage Vf1 stored in the memory of the main microcomputer 33 provided in the low voltage side device 12 connected to the high voltage side device 11 via the insulating interface 32, and determines that an abnormality occurs in the A/D converter 26 if the differences are larger than the predetermined threshold. Accordingly, by generating the sample voltage Vf1 based on the reference voltage Vf0 for A/D conversion output from the reference power supplies 71-1 to 71-5, reduction of production costs can be achieved without requiring a separate power supply used to determine the abnormality of the A/D converter 26.

The reference power supplies 71-1 to 71-5 are power supplies which output a stable voltage for A/D conversion, i.e., the reference voltage Vf0, to the A/D converter. Accordingly, by generating the sample voltage Vf1 based on the reference voltage Vf0 for A/D conversion output from the reference power supplies 71-1 to 71-5, it is possible to determine the abnormality of the A/D converter 26 with high precision.

In addition, a difference of the voltage data corresponding to the sample voltage Vf1 stored in the main microcomputer 33 provided in the low voltage side device 12 is obtained, and, if the difference is larger than the predetermined threshold, it is determined that an abnormality occurs in the A/D converter 26. For this reason, the voltage data corresponding to the sample voltage Vf1 stored in the memory of the main microcomputer 33 can be randomly set, thereby providing a voltage measuring apparatus 10 with a wide range of uses.

In addition, the sample voltage Vf1 is generated by dividing the reference voltage Vf0 by means of the first resistor R1 with the node P1 connected to the reference power supply and the second resistor R2 connected to the node P2 of the first resistor R1 and connected in series from the reference power supply 71-1 to 71-5. Accordingly, by changing resistance values of the first and second resistors R1 and R2, it is possible to set the generated sample voltage Vf1 randomly.

Figure 4:
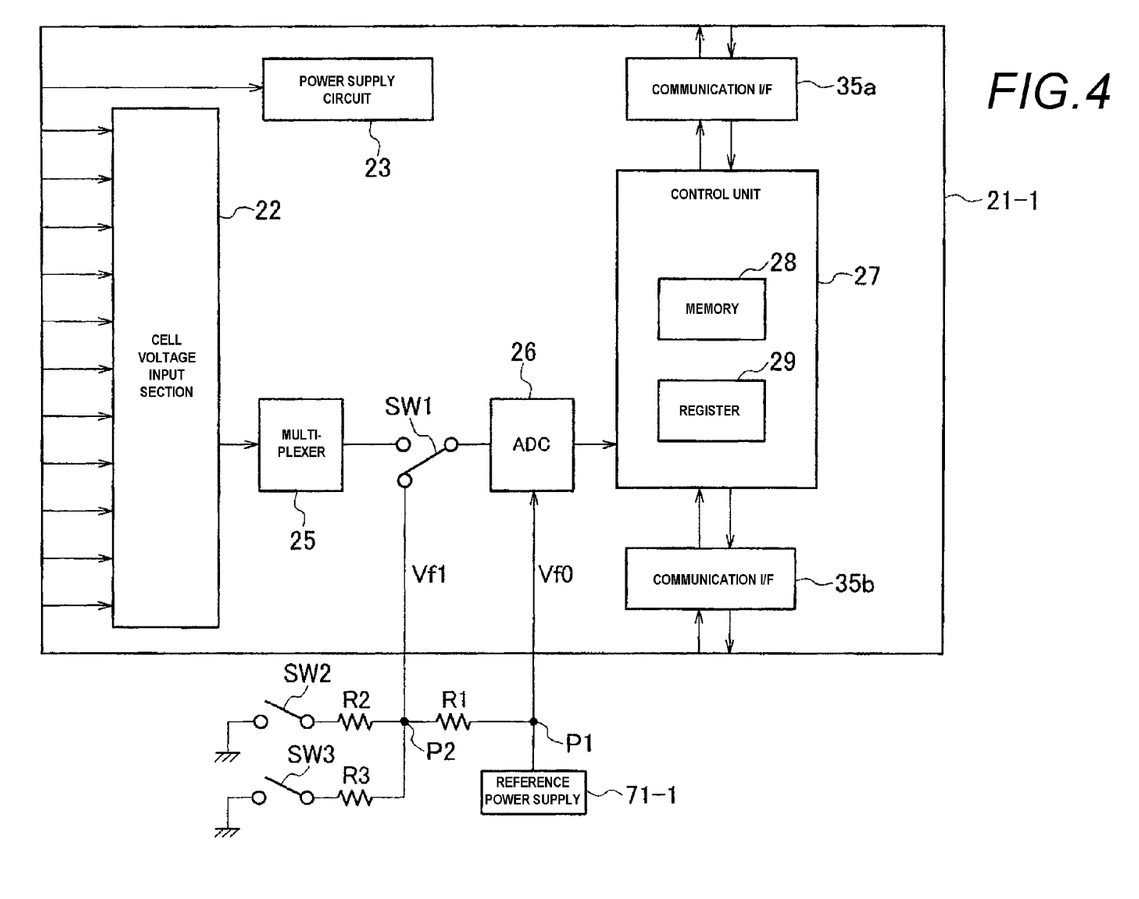
FIG. 4 is a block diagram showing a detailed configuration of a voltage measuring apparatus according to another embodiment of the present invention.

Next, another embodiment of the present invention will be described with reference to the drawings. FIG. 4 shows another embodiment of the present invention. Here, the same components as the above-described embodiment are denoted by the same reference numerals, and explanation thereof will not be repeated. FIG. 4 is a block diagram showing a detailed configuration of a voltage measuring apparatus according to another embodiment of the present invention. Hereinafter, a configuration of the first voltage detection IC 21-1 will be described in detail with reference to FIG. 4. Since the second to fifth voltage detection ICs 21-2 to 21-5 have the same configuration as the first voltage detection IC 21-1, detailed explanation thereof will be omitted.

As shown in FIG. 4, the first voltage detection IC 21-1 includes a first resistor R1, a second resistor R2 and an additional third resistor R3 which divide the reference voltage Vf0 output from the reference power supply 71-1 to generate a sample voltage Vf1.

In addition, the first voltage detection IC 21-1 includes a switch SW1 which switches between a voltage signal of each unit cell output from the multiplexer 25 and a voltage signal outputting the sample voltage Vf1. The first voltage detection IC 21-1 further includes a switch SW2 and a switch SW3 which switch a connection state of one of the second resistor R2 and the third resistor R3.

The first resistor R1 has one end (first end) connected to a node P1 which is an output terminal of the reference power supply 71-1 and the other end (second end) connected to a node P2 which is an output terminal which outputs the sample voltage Vf1 to the A/D converter 26. In addition, the second resistor R2 connected in series from the reference power supply 71-1 and the third resistor R3 connected in parallel to the second resistor R2 are connected to the node P2.

Then, when the sample voltage Vf1 is generated by the first to third resistors R1, R2 and R3 dividing the reference voltage Vf0, the switch SW1 switches the voltage signal of each unit cell to supply the sample voltage Vf1 to the A/D converter 26, with the switches SW2 and SW3 closed.

In addition, when the sample voltage Vf1 is generated by the first and second resistors R1 and R2 dividing the reference voltage Vf0, the switch SW1 supplies the sample voltage Vf1 to the A/D converter 26, with the switch SW2 closed.

In addition, when the sample voltage Vf1 is generated by the first and third resistors R1 and R3 dividing the reference voltage Vf0, the switch SW1 supplies the sample voltage Vf1 to the A/D converter 26, with the switch SW3 closed.

When the sample voltage Vf1 is supplied, a plurality of sample voltages Vf1 can be generated by setting the second and third resistors R2 and R3 to different resistance values. For example, if a reference voltage of 5V for A/D conversion is output from the reference power supply 71-1, assuming a resistance value of the first resistor R1 is equal to a resistance value of the second resistor R2, the reference voltage of 5V is divided by the first and second resistors R1 and R2 to generate a sample voltage 2.5V which is then supplied to the A/D converter 26. In addition, assuming a resistance value of the third resistor R3 is twice as large as a resistance value of the first resistor R1, the reference voltage of 5V is divided by the first and third resistors R1 and R3 to generate a sample voltage 3.33V which is then supplied to the A/D converter 26.

Although it has been illustrated that each voltage detection IC 21-1 to 21-5 in the voltage measuring apparatus 10 according to the embodiment of the present invention generates the sample voltage Vf1 based on the reference voltage Vf0 for A/D conversion output from the reference power supplies 71-1 to 71-5 and compares the digital voltages Vf1-1 to Vf1-5, which are obtained by digitizing the sample voltage Vf1 by means of the A/D converter 26, with the voltage data corresponding to the sample voltage Vf1 stored in the memory (not shown) of the main microcomputer 33 (see FIG. 1), the control unit 27 may further include a memory 28 and a register 29 for data storage and may be configured to collectively control the first voltage detection IC 21-1, as shown in FIG. 4. In this case, the control unit 27 compares the digital voltages Vf1-1 to Vf1-5 obtained by the A/D converter 26 digitizing the sample voltage Vf1, which can be obtained by dividing the reference voltage Vf0 by means of the first to third resistors R1, R2 and R3, with the voltage data stored beforehand in the memory 28, thereby obtaining a difference therebetween, and, if the difference is larger than the predetermined threshold, transmits an abnormality of the A/D converter to the main microcomputer 33 while storing the abnormality of the A/D converter in the register 29.

In this manner, the voltage measuring apparatus 10 according to another embodiment of the prevent invention generates the sample voltage Vf1 based on the reference voltage Vf0 for A/D conversion output from the reference power supplies 71-1 to 71-5 and obtains differences between the digital voltages Vf1-1 to Vf1-5, which are obtained by digitizing the sample voltage Vf1 by means of the A/D converter 26, and the voltage data corresponding to the sample voltage Vf1 stored in the register 29. Then, if the differences are larger than the predetermined threshold, it is determined that an abnormality occurs in the A/D converter 26. Accordingly, by generating the sample voltage Vf1 based on the reference voltage Vf0 for A/D conversion output from the reference power supplies 71-1 to 71-5, reduction of production costs can be achieved without requiring a separate power supply used to determine the abnormality of the A/D converter 26.

The reference power supplies 71-1 to 71-5 are power supplies which output a stable voltage for A/D conversion, i.e., the reference voltage Vf0, to the A/D converter 26. Accordingly, by generating the sample voltage Vf1 based on the reference voltage Vf0 for A/D conversion output from the reference power supplies 71-1 to 71-5, it is possible to determine the abnormality of the A/D converter 26 with high precision.

In addition, a plurality of sample voltages Vf1 is generated by switching a connection state of one of the second resistor R2 and the third resistor R3 connected in parallel to the second resistor R2. In this case, the plurality of sample voltages Vf1 can be generated by setting the second and third resistors R2 and R3 to different resistance values.

Although the voltage measuring apparatuses according to the shown embodiments of the present invention have been illustrated above, the present invention is not limited thereto, but configuration of various components in the voltage measuring apparatuses may be replaced with any other configuration having the same function.

For example, although it has been illustrated in the above-described embodiments that the reference voltage Vf0 is divided by means of the first to third resistors R1, R2 and R3, the connection number of voltage dividing resistors may be three or more. In this case, by generating more sample voltages Vf1, it is possible to determine the abnormality of the A/D converter with higher precision.

In addition, although it has been illustrated in the above-described embodiments that the sample voltage Vf1 is generated by closing the switches SW2 and SW3 to switch the connection state of the second resistor R2 or the third resistor R3, it is further possible to generate sample voltages Vf1 of the first and second resistors R1 and R2, the first and third resistors R1 and R3, and the first to third resistors R1, R2 and R3 by generating the sample voltage Vf1 by combination of the second and third resistors R2 and R3 by closing the switches SW2 and SW3.

The present invention is very useful to detect an abnormality of an A/D converter of a voltage measuring apparatus which detects a voltage of an assembled battery including a plurality of unit cells connected in series in order to output a desired voltage.

What is claimed is:

1. A voltage measuring apparatus for measuring an output voltage of an assembled battery in which a plurality of unit cells are connected in series and are divided into a plurality of blocks, the voltage measuring apparatus comprising: a block voltage detection section which detects a voltage of at least one of the plurality of blocks and provides an analog voltage signal; a reference power supply which generates a reference voltage for A/D conversion; a sampling voltage generation section which generates a sampling voltage based on the reference voltage; a storage for storing voltage data corresponding to the sampling voltage; an A/D conversion section which is arranged in the block voltage detection section and digitizes the analog voltage signal with the reference voltage for A/D conversion and digitizes the sampling voltage with the reference voltage for A/D conversion; a voltage comparing section which compares the digitized sampling voltage with the voltage data stored in the storage; and an abnormality determining section which calculates a difference between the digitized sampling voltage and the voltage data and determines that abnormality occurs in the A/D conversion section when the difference is larger than a threshold.

2. The voltage measuring apparatus according to claim 1, comprising a high-voltage side device and a low-voltage side device connected via an insulating interface to the high-voltage side device, wherein
the block voltage detection section, the reference power supply, the sampling voltage generation section, the storage, and the A/D conversion section, are arranged in the high-voltage side device, and
the voltage comparing section and the abnormality determining section are arranged in the low-voltage side device.

3. The voltage measuring apparatus according to claim 1, comprising:
a first resistor having a first end and a second end, the first end connected to the reference power supply; and
a second resistor connected to the second end of the first resistor from the reference power supply in series, wherein
the sampling voltage generation section generates the sampling voltage by dividing the reference voltage by the first and second resistors.

4. The voltage measuring apparatus according to claim 1, comprising:
a first resistor having a first end and a second end, the first end connected to the reference power supply;
a second resistor connected to the second end of the first resistor from the reference power supply in series; and
a third resistor connected to the second end of the first resistor and connected in parallel to the second resistor, wherein
the sampling voltage generation section has an ability of generating a plurality of sampling voltages by switching a connection state of at least one of the second and third resistors.

5. The voltage measuring apparatus according to claim 1, comprising a high-voltage side device and a low-voltage side device connected via an insulating interface to the high-voltage side device, wherein the block voltage detection section, the reference power supply, the sampling voltage generation section, the storage, the A/D conversion section, the voltage comparing section and the abnormality determining section are arranged in the high-voltage side device, and the abnormality determining section transmits an abnormality determination result to the low-voltage side device.

* * * * *